United States Patent [19]

Garrett

[11] Patent Number: 4,558,984

[45] Date of Patent: Dec. 17, 1985

[54] WAFER LIFTING AND HOLDING APPARATUS

[75] Inventor: Charles B. Garrett, San Jose, Calif.

[73] Assignee: Varian Associates, Inc., Palo Alto, Calif.

[21] Appl. No.: 763,079

[22] Filed: Aug. 5, 1985

Related U.S. Application Data

[63] Continuation of Ser. No. 611,672, May 18, 1984, abandoned.

[51] Int. Cl.$^4$ .............................................. C23C 13/08
[52] U.S. Cl. .................................... 414/609; 198/345; 198/775; 414/217; 414/222; 414/331; 414/417; 414/785
[58] Field of Search ............... 414/217, 222, 592, 609, 414/417, 785; 198/345, 775; 294/20, 22, 64 B; 118/50, 724

[56] References Cited

U.S. PATENT DOCUMENTS 3,973,665  8/1976  Giammanco ..................... 414/217 X
4,500,407  2/1985  Boys et al. ...................... 414/217 X Primary Examiner—Robert G. Sheridan
Attorney, Agent, or Firm—Stanley Z. Cole; Kenneth L. Warsh

[57] ABSTRACT

An automatic sputtering apparatus for coating semiconductor wafers uses shuttle wafer carriers and elevators to handle wafers within the apparatus. The wafer carrier has a hole in the center. One side of the wafer carrier is opened, thereby forming a throat in the shuttle wafer carrier in the form of the letter C. The elevator has a cantilevered shaft. The upper part of the shaft of the elevator is centered under the wafer while the lowest part of the cantilevered shaft is under a point outside the wafer carrier. The connecting portion of the shaft passes through the throat of the wafer carrier as the wafer is lifted. Since the lifting portion of the shaft is outside the wafer carrier, the shuttle can move with the elevator in the up position. The pedestal for holding the wafer on the elevator is equipped with arms which project upward at an angle to the horizontal, thereby confining the wafer to a pedestal.

11 Claims, 8 Drawing Figures

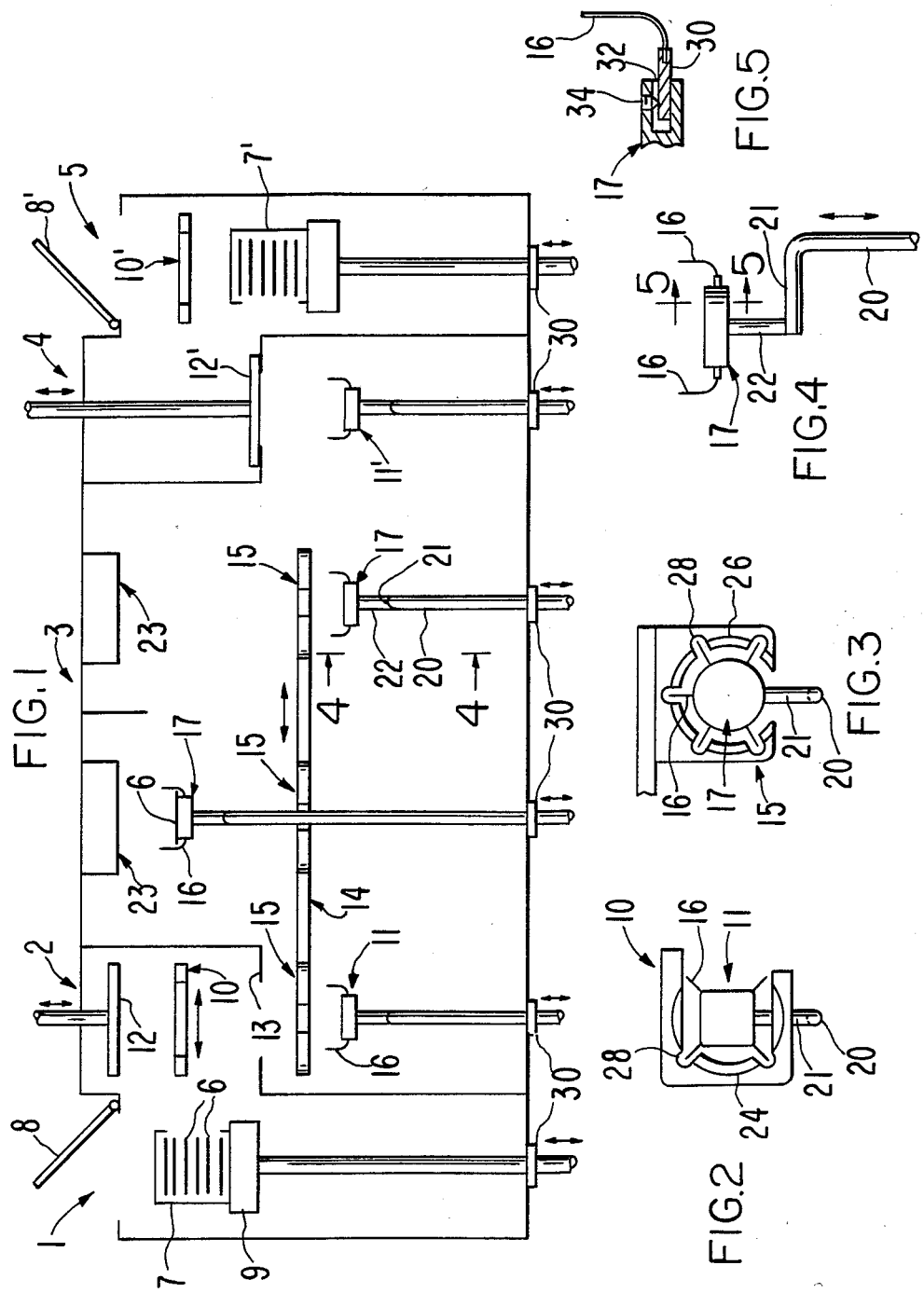

WAFER LIFTING AND HOLDING APPARATUS

This application is a continuation of application Ser. No. 611,672, filed May 18, 1984, now abandoned.

FIELD OF THE INVENTION

This invention pertains to a workpiece lifting apparatus for removing a workpiece from a delivery shuttle.

BACKGROUND OF THE INVENTION

In the semiconductor industry, systems for transporting wafers between process locations in a sputtering system are well known. Typically circular silicon wafers of various diameters are moved between positions at which metallic coatings are sputtered onto the wafer or at which etching occurs. This process takes place in a vacuum chamber in order to eliminate contamination of the wafer surface. The goal of all such transport systems is to move the wafer from one process location to another.

The transport system within the vacuum chamber can include shuttles to move wafers horizontally and elevators to move wafers vertically. The motion of such shuttles and elevators must be coordinated in order to deliver the wafer from shuttle to elevator or elevator to shuttle. In order to increase the efficiency and volume of output of wafer processing systems, sputtering systems are often designed to process multiple wafers at the same time. Such multiple wafer systems often require moving a shuttle past an internal station where a wafer is being processed without interfering.

Shuttles which pass wafers along a track in a horizontal position are often used with elevators which lift the wafer from the shuttle through a hole in the center of the shuttle. These transport systems have the disadvantage that the shuttle cannot be moved while the elevator is up. Only after the elevator has returned the wafer to the shuttle and withdrawn from the center of the shuttle can the shuttle move.

The objects of this invention then are to describe an elevator and shuttle suitable for lifting a workpiece from a shuttle while permitting the shuttle to move while the elevator is in the up position, to make such an apparatus simple, rugged and inexpensive to manufacture, and to provide firm support for the wafer at all times.

BRIEF SUMMARY OF THE INVENTION

The shuttle wafer carrier is constructed with a hole in the center, as in the prior art. One side of the wafer carrier is opened, thereby forming a throat in the shuttle wafer carrier in the form of the letter C. The elevator has a cantilevered shaft. The pedestal for contacting the wafer is centered under the wafer and the lowest portion of the lifting shaft is under a point outside the shuttle. The connecting portion of the shaft passes through the throat in the wafer carrier as the wafer is lifted. Since the lifting portion of the shaft is outside the shuttle, the shuttle can move with the elevator in the up position. The pedestal for holding the wafer on the elevator is equipped with arms which project upward at an angle to the horizontal, thereby confining the wafer to a pedestal.

The shuttles are moved from the exterior of the chamber by magnetic couplings. The invention includes a first magnet located outside the process chamber and attached by any means which will cause the magnet to be moved horizontally parallel to the wall of the chamber. A second magnet is located inside the process chamber adjacent to the first magnet and in an alignment such that an attraction force exists between the magnets. The second magnet is rigidly fixed to a pair of parallel transport rails which support wafer support arms. Each transport rail is connected by a bearing means to a guide rail which permits the transport rails to move in a horizontal plane in response to movement of the first magnet which causes the second magnet to follow its movement.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 1 is a schematic cross-sectional diagram of a wafer coating system showing the general environment of the invention.

FIG. 2 is a top view of the first shuttle and first elevator.

FIG. 3 is a top view of a wafer carrier on the second shuttle with the second elevator.

FIG. 4 is a side view of the second elevator.

FIG. 5 is a sectional view through the elevator pedestal and projecting arms along the section 5—5 of FIG. 4.

DESCRIPTION OF THE PREFERRED EMBODIMENT

Figure 6:
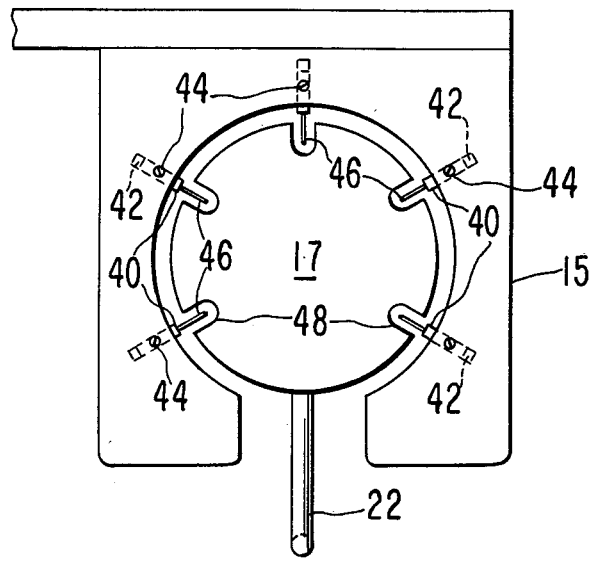
FIG. 6 is a top view of a further embodiment of a pedestal and shuttle.

Referring now to the drawings wherein reference numerals are used to designate parts throughout the various figures thereof, there is shown in FIG. 1 a schematic diagram of the general environment of the invention. The environment shown, for example, is a sputter coating system for coating semiconductor wafers. In FIG. 1 there is shown a loading chamber 1 having input opening with movable sealing door, an inlet or transfer loadlock chamber 2, a processing chamber 3, an outlet loadlock or transfer chamber 4, and an unloading chamber 5 having output opening with movable sealing door.

Although only two processing stations are illustrated in FIG. 1, there can be more than two. For example, it might be advantageous to include RF etching, more than one type of sputtering and annealing in one plating machine.

Semiconductor wafers 6 in a cassette 7 are inserted through a load door 8 to rest on an elevator 9, after which the door is closed. A first horizontally reciprocal shuttle 10 is movable to the left from the position shown in chamber 2 to a position in chamber 1, wherein it is inserted below a given wafer, and elevator 9 is lowered sufficiently to deposit a wafer on first shuttle 10. Then shuttle 10 is moved to the right to the position shown in FIG. 2 at which time an elevator pedestal 11 moves upwardly to lift the wafer above shuttle 10. Next, shuttle 10 moves left again into chamber 1, and then elevator pedestal 11 is lowered downwardly into the bottom left compartment of chamber 3. Next, valve 12 is lowered to form a vacuum seal against annular rim 13.

When elevator pedestal 11 moves downwardly, it deposits the wafer on a second shuttle 14 having three or more horizontally spaced projectors 15 or wafer carriers for carrying wafers.

Means, not shown, are provided for moving the shuttles 10 and 14 horizontally back and forth. Any conventional means for imparting the back and forth movement, such as magnetic drive means wherein a magnet mounted outside the chamber is driven back and forth and is magnetically coupled to a magnet on the shuttle so that the shuttle follows the movement of the external magnet. One such drive is shown in copending U.S. patent application No. 381,022 filed May 24, 1982 for "Wafer Transport System", now abandoned, the disclosures of which are hereby incorporated by reference. It should be understood that the shuttles are mounted on horizontal guide rods on one side wall of their chambers in cantilever fashion so that the open ends of the projectors 15 face away from the guide rods for free passage of the pedestal supports through such open ends.

The movements of the shuttles are as follows. The shuttle 14 moves to the left in FIG. 1 to receive the wafer 6. The shuttle 14 then moves to the right to the first processing station. The wafer is then taken on the wafer pedestal 17 and raised to the processing position. The shuttle 14 then moves partially back to the left to a "parking" position where the projectors 15 will receive a minimum of plating from the processing station. After processing of the wafer is completed at the first station the shuttle 14 returns completely to the left. The first wafer is then lowered to the second projector 15 from the left while a new wafer is placed on the leftmost projector 15. In the next cycle the first wafer is moved to the second processing station while the second wafer is moved to the first processing station.

FIG. 2 is a top view of shuttle 10 and also shows elevator pedestal 11. The upper end of the elevator pedestal 11 is shown with four projecting arms 16 which horizontally continue.

FIG. 3 shows one of the wafer carriers 15 on shuttle 14, and an elevator pedestal 17 of slightly different shape than elevator pedestal 11, but again, carrying projecting arms 16.

There must be a minimum of three projecting arms 16 and there may be four, five or more as shown in FIGS. 2 and 3. The projecting arms may be stiff wires or fine rods. Small bars, shims and tubes would also be suitable. In other environments which do not involve high temperatures, plastic, rubber or other materials may be used for the projecting arms.

In order for shuttle 14 to move horizontally when one or more of the elevator pedestals 11 and 17 are elevated, these elevators are driven by an offset arrangement as shown in FIG. 4, taken, for example, on line 4-4 through the right-hand elevator in FIG. 1. Thus, there is a lifting rod 20, an offset or horizontal rod 21 and a vertical rod 22. Other shapes than rods can be used. The rods 20, 21 and 22 can be attached at right angles as shown in FIG. 4 or at angles which deviate slightly from a right angle. It is considered equivalent to use one cantilevered, s-shaped or dog-leg rod as shown in FIG. 4 in place of the 3 rods 20, 21 or 22 together as described. The lifting rod 20 passes through a sealing means 30 to an actuator. The actuator may be pneumatic or electrical. In the preferred embodiment, the elevators of the loading and unloading chambers are actuated by electrical stepping motors to provide incremental vertical steps. The sealing means 30 may be O-rings, bellows or other such devices.

The shuttle 10 and carrier 15 can be formed with recesses 24 and 26 which confine the wafer horizontally. Inlets 28 in the pedestals 11 and 17 provide means to pass the projecting arms through the pedestal while providing support for the waver.

The projecting arms 16 are joined to the elevator pedestals 11 and 17 at approximately equal spacing. As shown in FIG. 5, the projecting arms are mounted in locating pins 30. The locating pins are set into sockets 32 and held by set screws 34, thereby allowing the projecting arms to be adjusted in position for proper clearance from the wafer. The pedestals 11 or 17 can also be eliminated and the projecting arms 16 attached directly to the vertical rod 22. In another alternate embodiment the projecting arms 16 can be eliminated and the wafer taken directly on the wafer pedestals 11 or 17.

Figure 7:
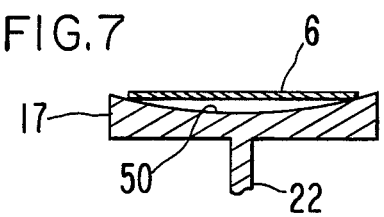
FIG. 7 is a side view of the pedestal of FIG. 6.
Figure 8:
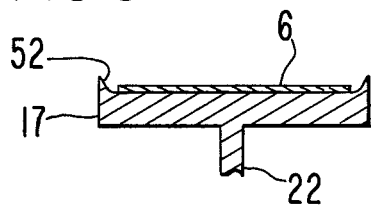
FIG. 8 is a side view of a pedestal showing a further modification.

In another embodiment shown in FIGS. 6-8 particularly suitable for RF etching, the pedestal can be made larger than the wafer to insure electrical contact along the edge of the wafer. Thus the opening in the projector 15 would be made larger. The projector rather than the pedestal would now carry at least three projecting arms 46, set into locating pins 40. The projectors have holes 42 into which the locating pins 40 are held with set screws 44. The pedestal 17 has a depression 50, or a lip 52 to hold the wafer. The pedestal 17 has inlets 48 to allow clearance of the projecting arms 46.

Vacuum pumping means are provided to pump separately the loading chamber 1, the processing chamber 3 and the unloading chamber 5.

The invention thus described permits movement of the shuttle while the elevator is in an up position, provides firm support for the wafers with minimum contact and is rugged, simple and inexpensive to manufacture.

This invention is not limited to the preferred embodiments heretofore described, to which variations and improvements may be made, consisting of mechanically and electrically equivalent modifications to component parts, without leaving the scope of protection of the present patent, the characteristics of which are summarized in the following claims.

What is claimed is:

1. A workpiece handling apparatus, comprising:
    an elevator pedestal having top and bottom;
    an elongated first vertical support member having top and bottom ends, said elevator pedestal being attached to said top end of said first vertical support member at said bottom of said elevator pedestal;
    an offsetting support member having first and second ends, said elongated vertical support member being attached to said first end of said offsetting support member at said bottom end of said first vertical support member;
    an elongated second vertical support member having top and bottom ends, said offsetting support member being attached to said top end of said second vertical support member at said second end of said offsetting support member, whereby said first and second vertical support members are generally parallel but offset from each other;
    means for actuating attached to said bottom end of said lifting support member;
    a shuttle wafer carrier having central opening and throat open to one side, with said carrier oriented so that said offsetting support member can pass through said throat as the workpiece is raised; and means for moving said shuttle wafer carrier.

2. A workpiece handling apparatus as in claim 1 where said shuttle wafer carrier has recesses which confine the wafer horizontally.

3. A workpiece handling apparatus as in claim 1 including at least three projecting arms approximately equally spaced and attached to said pedestal, said projecting arms being approximately equally spaced and attached at an angle to the horizontal so as to horizontally confine the workpiece, and where said shuttle wafer carrier has inlets for the passage of said projecting arms through said shuttle.

4. A workpiece handling apparatus, comprising:
an elevator pedestal;
an elongated lifting support member;
means for offsetting said pedestal from said lifting support member;
means for actuating said support member;
a shuttle wafer carrier having central opening and throat open to one side, with said carrier oriented so that said means for offsetting said pedestal can pass through said throat as the workpiece is raised; and
means for moving said shuttle wafer carrier.

5. A workpiece handling apparatus, comprising:
a cantilevered lifting support member having top and bottom ends;
means for actuating said support member;
at least three projecting arms attached to said top of said support member, said projecting arms being approximately equally spaced and attached at an angle to the horizontal so as to horizontally confine the workpiece;
a shuttle wafer carrier having central opening and throat open to one side, with said carrier oriented so that said projecting arms can pass through said opening and said cantilevered lifting support member can pass through said throat as the workpiece is raised; and
means for moving said shuttle wafer carrier.

6. A workpiece handling apparatus as in claim 4 including at least three projecting arms attached to said pedestal, said projecting arms being approximately equally spaced and attached at an angle to the horizontal so as to horizontally confine the workpiece.

7. A workpiece handling apparatus as in claim 6 wherein said central opening in said shuttle wafer carrier has inlets in said opening for the passage of said projecting arms through said shuttle as the workpiece is raised.

8. A workpiece handling apparatus as in claim 4 including at least three projecting arms attached to said shuttle wafer carrier, said projecting arms being approximately equally spaced and attached horizontally so as to support the workpiece.

9. A workpiece handling apparatus as in claim 6 wherein said pedestal has inlets on its periphery for the passage of said projecting arms as the workpiece is raised.

10. A workpiece handling apparatus as in claims 1, 3, 4, 5 or 7 where said shuttle wafer carrier has recesses which confine the workpiece horizontally.

11. Workpiece handling apparatus, comprising:
a carrier including an opening therethrough and having workpiece carrying means adjacent said opening and adapted to releasably carry a workpiece in alignment with said opening, said opening including a side portion extending to and through an edge of said carrier;
a support structure with support means connected to said support structure and adapted to releasably support a workpiece adjacent an end portion of the support structure;
means for reciprocating said support structure such that said support means on the support structure moves along a first path of travel;
said carrier being adapted for movement along a second path of travel transverse to said first path of travel to move said carrier between spaced positions, including one position in which said support means on said support structure is aligned with said opening in the carrier;
said support means on the support structure being dimensioned to fit through said opening, whereby when support means is moved along said first path of travel, said support means will pass through said opening when the carrier is stationed in said one position;
said support structure having an offset portion spaced outwardly from said first path of travel, said offset portion being configured such that when said support means on the support structure is moved through said aperture to move a workpiece from said carrier to a position spaced from the carrier, said offset portion is spaced outwardly of said edge of the carrier; whereby when a workpiece is thus positioned on said support means, said carrier is free to move away from said one position without contacting said support structure.

* * * * *